(12) United States Patent
Hebert et al.

(10) Patent No.: US 9,691,893 B2
(45) Date of Patent: Jun. 27, 2017

(54) LOW-COST SEMICONDUCTOR DEVICE MANUFACTURING METHOD

(71) Applicant: Magnachip Semiconductor, Ltd., Cheongju-si (KR)

(72) Inventors: Francois Hebert, San Mateo, CA (US); Yon Sup Pang, Cheonan-si (KR); Yu Shin Ryu, Daejeon (KR); Seong Min Cho, Cheongju-si (KR); Ju Ho Kim, Daejeon (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 333 days.

(21) Appl. No.: 14/518,328

(22) Filed: Oct. 20, 2014

(65) Prior Publication Data

US 2015/0255595 A1    Sep. 10, 2015

(30) Foreign Application Priority Data

Mar. 6, 2014   (KR) .................. 10-2014-0026362

(51) Int. Cl.
*H01L 21/761*   (2006.01)
*H01L 29/78*    (2006.01)
(Continued)

(52) U.S. Cl.
CPC .... *H01L 29/7816* (2013.01); *H01L 21/28141* (2013.01); *H01L 21/761* (2013.01);
(Continued)

(58) Field of Classification Search
CPC ......... H01L 21/26586; H01L 21/28141; H01L 21/761; H01L 21/82381; H01L 27/0922; H01L 27/0928; H01L 29/66598
See application file for complete search history.

(56) References Cited

U.S. PATENT DOCUMENTS 4,325,180 A    4/1982 Curran
5,021,851 A    6/1991 Haken et al.
(Continued)

OTHER PUBLICATIONS

Ko, Kwang-Young et al., "BD180LV-0.18 μm BCD Technology with Best-in-Class LDMOS from 7V to 30V". Proceedings of the 22$^{nd}$ International Symposium on Power Semiconductor Devices & ICs. (Jun. 2010) pp. 71-74. (4 pages in English).

*Primary Examiner* — Whitney T Moore
*Assistant Examiner* — Joseph Galvin, III
(74) *Attorney, Agent, or Firm* — NSIP Law

(57) ABSTRACT

Provided are a low-cost semiconductor device manufacturing method and a semiconductor device made using the method. The method includes forming multiple body regions in a semiconductor substrate, forming multiple gate insulating layers and multiple gate electrodes in the body region; implementing a blanket ion implantation in an entire surface of the substrate to form a low concentration doping region (LDD region) in the body region without a mask, forming a spacer at a side wall of the gate electrode, and implementing a high concentration ion implantation to form a high concentration source region and a high concentration drain region around the LDD region. According to the examples, devices have favorable electrical characteristics and at the same time, manufacturing costs are reduced. Since, when forming high concentration source region and drain regions, tilt and rotation co-implants are applied, an LDD masking step is potentially omitted.

14 Claims, 12 Drawing Sheets

(51) Int. Cl.
*H01L 21/28* (2006.01)
*H01L 29/66* (2006.01)
*H01L 21/8238* (2006.01)
*H01L 27/092* (2006.01)
*H01L 29/872* (2006.01)
*H01L 21/265* (2006.01)
*H01L 29/423* (2006.01)
*H01L 29/08* (2006.01)
*H01L 29/10* (2006.01)
*H01L 29/40* (2006.01)
*H01L 29/06* (2006.01)

(52) U.S. Cl.
CPC .. *H01L 21/823814* (2013.01); *H01L 27/0922* (2013.01); *H01L 27/0928* (2013.01); *H01L 29/1095* (2013.01); *H01L 29/6659* (2013.01); *H01L 29/66598* (2013.01); *H01L 29/66659* (2013.01); *H01L 29/66681* (2013.01); *H01L 29/7833* (2013.01); *H01L 29/7835* (2013.01); *H01L 29/872* (2013.01); *H01L 21/26586* (2013.01); *H01L 29/0619* (2013.01); *H01L 29/0847* (2013.01); *H01L 29/1083* (2013.01); *H01L 29/1087* (2013.01); *H01L 29/402* (2013.01); *H01L 29/42368* (2013.01)

(56) References Cited

U.S. PATENT DOCUMENTS

| | | | |
|---|---|---|---|
| 6,599,782 B1 * | 7/2003 | Kikuchi | H01L 29/66659 257/E21.427 |
| 6,677,210 B1 * | 1/2004 | Hebert | H01L 29/0847 257/408 |
| 7,304,348 B2 * | 12/2007 | Ehwald | H01L 29/0615 257/328 |
| 2009/0273028 A1 * | 11/2009 | Mallikarjunaswamy | H01L 21/26513 257/335 |

* cited by examiner

LOW-COST SEMICONDUCTOR DEVICE MANUFACTURING METHOD

CROSS-REFERENCE TO RELATED APPLICATIONS

This application claims the benefit under 35 U.S.C. §119(a) of Korean Patent Application No. 10-2014-0026362 filed on Mar. 6, 2014, in the Korean Intellectual Property Office, the entire disclosure of which is incorporated herein by reference for all purposes.

BACKGROUND

1. Field

The following description relates to a low-cost semiconductor device manufacturing method. The following description also relates to a semiconductor device that has a lowered manufacturing cost by reducing a masking process step used in a manufacturing process of the semiconductor device, and a manufacturing method of such a semiconductor.

2. Description of Related Art

Usually, a one-time manufacturing process of various semiconductor devices in one substrate imposes enormous expenses. These expenses arise because every time respective devices are produced, dozens of masks are inserted in the process flow. Accordingly, dozens of photolithography processes and etching processes accompany the masking steps. The more such processes of masking, photolithography, and masking are repeated, the more the manufacturing cost per unit increases. In order to produce significantly lower cost semiconductor devices or chips, it is helpful to minimize the number of masking steps. The process flow for manufacturing a Bipolar-Complementary Metal-Oxide-Semiconductor (CMOS)-Double-Diffused Metal-Oxide-Semiconductor (DMOS) (BCD) type technology that integrates many different active and passive devices on one substrate, for analog and power management applications is considered in greater detail.

The BCD consists of a combination of Bipolar, CMOS, and DMOS power devices, passive devices, and interconnection devices. An example of a device structure using integration in BCD technologies is a fully isolated Lateral n-channel Metal-Oxide-Semiconductor Field-Effect-Transistor (MOSFET) (nLDMOS). A BCD flow architecture using LDMOS devices, Bipolar, CMOS, one gate oxide, one polysilicon gate and three layers of metal, referred to as a whole as a 1P3M flow, with reference to the one layer of polysilicon gate and three layers of metal, may require more than 20 masking layers. For example, such an architecture typically uses 22-23 masking layers. The resulting wafer cost is therefore high, due to the use of so many masking layers and other related necessary processes.

In BCD, BiCMOS and CMOS technologies, to solve the increasing manufacturing cost challenge, the number of masking operations may be minimized. Here, BiCMOS is an advanced semiconductor technology that integrates the bipolar junction transistor and the CMOS transistor into a single integrated circuit device. If the manufacturing process is broken down into separate modules, most standard technologies use separate and dedicated N-channel low-doped-drain (NLDD) and P-channel low-doped-drain (PLDD) masking and implant operations to form the low-doped-drain (LDD) extensions of the N-channel and P-channel devices respectively. The NLDD mask is needed for formation of LDD (low doped drain) region for NMOS; the PLDD mask is necessarily needed for formation of LDD region for PMOS. Thus, if it is possible to reduce the number of such LDD masks used for formation of LDDs of NMOS and PMOS transistors, the manufacturing cost may be reduced.

Furthermore, it is desirable that the breakdown voltage ($BV_{dss}$) of an nLDMOS is maximized, Resistance of Drain-Source in the On-state ($R_{dson}$) is minimized, and the manufacturing cost thereof is also minimized. Constructing a device that has these aspects is desirable because they improve performance and reliability of the device while keeping costs manageable. However, for example, in a BCD device such as power devices used in DC-DC or DC-AC high current converters, there is no known BCD process technology that satisfies all the requirements and goals just discussed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a semiconductor device includes preparing a first region and a second region in a semiconductor substrate, forming a first body region having a high concentration of dopant in the first region to form a high-threshold voltage device, forming a second body region having a low concentration of dopant in the second region to form a low-threshold voltage device, forming a gate electrode over the first body region and the second body region, blanket implanting dopants of a second conductivity type into the first body and second body region to form low-doped drain (LDD) regions, forming a spacer next to the gate electrode, and source-drain implanting a second conductivity type of dopant to form a low-resistance source/drain region and low-doped extension that extends under the spacer, wherein the source-drain implantation comprises tilted and rotated implantation, and wherein the blanket implantation and the source-drain implantation are sufficient to compensate for enough of the first body region of the high-threshold voltage device, to ensure a low-resistance link between the source/drain region and a channel region.

The blanket implantation may have a low dose ranging from 1E11 to 5E13 ions $cm^{-2}$.

The source-drain implantation may further include performing substantially perpendicular implantation of a first dose with respect to a surface of the semiconductor substrate.

The tilted and rotated implantation may includes a second dose lower than the first dose at a tilted angle with respect to the surface of the semiconductor substrate so as to form the low-resistance link under the spacer.

The first dose may range from 5E14 to 1E16 ions $cm^{-2}$ and the second dose may range from 1E12 to 1E14 ions $cm^{-2}$.

The blanket implantation may skip all masking operations when forming the low-doped drain region.

In another general aspect, a semiconductor structure includes a first region and a second region in a semiconductor substrate, a lateral double diffused metal-oxide-silicon (LDMOS) device situated in the first region, a first buried layer having a second conductivity formed in the first region, a second buried layer having a first conductivity formed on the first buried layer, a drift region having the second conductivity formed on the second buried layer, a first body region of high concentration formed adjacent to the drift region, a first gate electrode formed over the drift region and the first body region, a spacer formed next to the gate electrode, a low resistance source region and a low-doped extension formed extending under the spacer, a body contact region having the first conductivity formed in the first body region, a low-resistance drain region spaced apart from the source region, a channel region formed in the first body region between the source region and the drain region, and a low resistance link between the source and drain regions and the channel region.

The structure may further include a low-threshold voltage device in the second region, and a second body region of low concentration in the second region.

The drift region and the second buried layer may be formed in a self-aligned manner, during the same masking operation.

A low-resistance link may be formed by a blanket implant operation and a tilted and rotated implantation of a source/drain operation.

In another general aspect, a method of manufacturing a semiconductor device, includes preparing a first region and a second region in a semiconductor substrate, forming a first body region having a high concentration of dopant in the first region to form a high-threshold voltage device, forming a second body region having a low concentration of dopant in the second region to form a low-threshold voltage device, forming a gate electrode over the first body region and the second body region, blanket implanting dopants of a second conductivity type into the first body and second body region to form low-doped drain (LDD) regions, forming a spacer next to the gate electrode, and source-drain implanting a second conductivity type of dopant to form a low-resistance source/drain region and low-doped extension that extends under the spacer.

The source-drain implantation may include tilted and rotated implantation.

The tilted and rotated implantation may include a second dose lower than the first dose at a tilted angle with respect to the surface of the semiconductor substrate so as to form the low-resistance link under the spacer.

The first dose may range from 5E14 to 1E16 ions cm$^{-2}$ and the second dose may range from 1E12 to 1E14 ions cm$^{-2}$.

The blanket implantation and the source-drain implantation may be sufficient to compensate for enough of the first body region of the high-threshold voltage device, to ensure a low-resistance link between the source/drain region and a channel region.

The blanket implantation may have a low dose ranging from 1E11 to 5E13 ions cm$^{-2}$.

The source-drain implantation may further include performing substantially perpendicular implantation of a first dose with respect to a surface of the semiconductor substrate.

The blanket implantation may skip all masking operations when forming the low-doped drain region.

According to the present examples, NLDD and PLDD masks are omitted and N-type dopants blanket ion implantation is implemented. As a result, the number of needed masks is minimized. By reducing the number of masks, the manufacturing cost is also reduced, while simultaneously achieving the desired electrical characteristics as a result of the alternative approach used in examples.

That is, according to the present examples, in the process of manufacturing a MOSFET structure such as an LDMOS that is produced along with a CMOS module having high performance characteristics, a BCD technology that incorporates such devices together while maintaining a low-cost is provided.

Other features and aspects will be apparent from the following detailed description, the drawings, and the claims.

DETAILED DESCRIPTION

Figure 1:
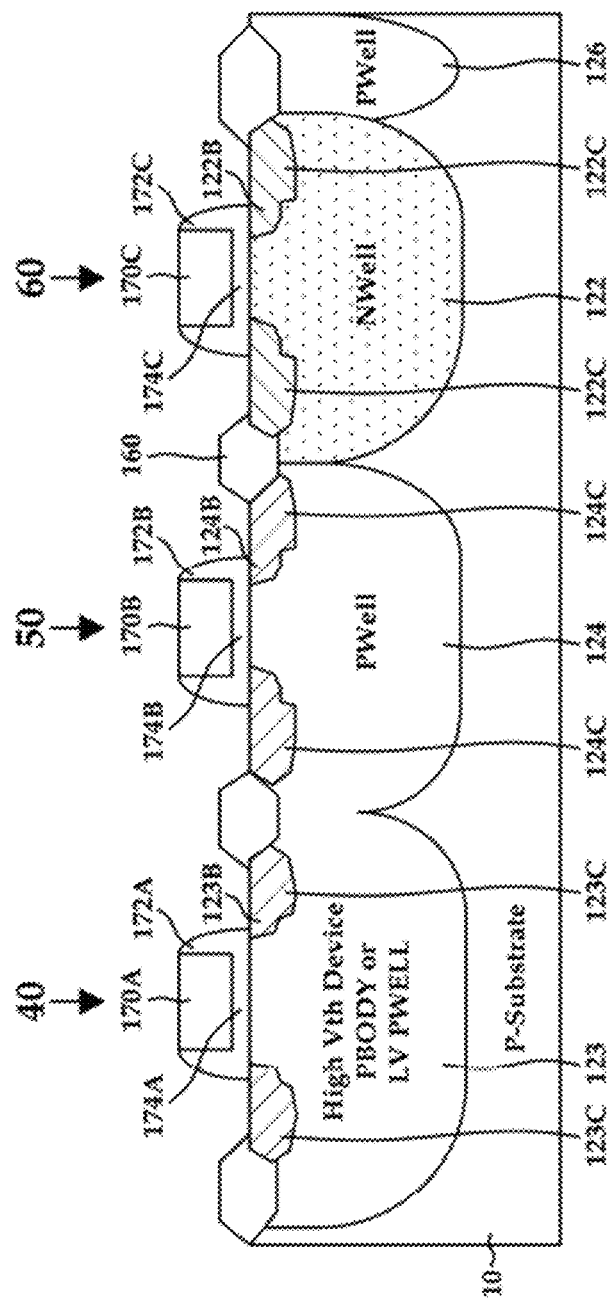
FIG. 1 depicts a view of a semiconductor device according to an example.

Hereinafter, among various devices that are manufactured at a low cost by a BCD technology in one substrate, a CMOS, a BiCMOS (Bipolar-CMOS), a CDMOS (CMOS-DMOS), and BCD (Bipolar-CMOS-DMOS) devices are taken as examples of such devices. Therefore, in such devices manufactured using such a BCD technology is a structure in which a CMOS is included. For example, the BCD technology referred to in this description includes examples such as an LDMOS device having high performance/voltage attributes, a CMOS for analog and logic functions, an analog scalable DMOS, which includes N and P channels, bipolar transistors, diode and other passive devices.

Thus, the CMOS devices considered in this description are divided into an NMOS, a PMOS, an Isolated CMOS and other appropriate groups. Here, isolation refers to approaches that reduce electrical interactions between transistors. The LDMOS device is divided into an nLDMOS or a pLDMOS. The nLDMOS refers to an n-channel Laterally Diffused Metal Oxide Semiconductor Field Effect Transistor (hereinafter, referred to as nLDMOS). The pLDMOS is a p-channel Laterally Diffused Metal Oxide Semiconductor Field Effect Transistor. Such transistors are fabricated via an epitaxial silicon layer on a more highly doped silicon substrate.

The nLDMOS and pLDMOS are devices that are used for successfully realizing power devices such as a DC-DC high current converter and regulator with desirable properties. According to the examples provided herein, the breakdown voltage ($BV_{dss}$) of nLDMOS is maximized; Resistance of Drain-Source in the On-state ($R_{dson}$) is minimized. Furthermore, the manufacturing cost is largely reduced. Thus, the examples provide devices with desirable performance attributes that are also relatively inexpensive.

A vertical NPN, a Lateral PNP, and/or a Schottky diode are examples of diodes that are included with respect to Bipolar transistors, diodes and other passive devices in the examples. Bipolar transistors are transistors that rely upon the contact of two types of semiconductor for their operation. In examples, such devices are manufactured in one semiconductor substrate through a low cost BCD process. Thus, according to the present examples, first, a MOSFET device in which an NMOS device, a PMOS device, and a high threshold voltage NMOS device are formed together is presented as an example. Also, there are analog scalable DMOS (N and P channels), bipolar transistors, diode and other passive devices, which are formed at the same time as the formulation of the low-cost MOSFET and they are discussed further below.

Among the existing technologies for CMOS design, there may be a case of forming an LDD using a tilted ion implantation method, under which the low dose quantity and generally high energy are applied in the process of ion implantation to form a source/drain. In such a technology, a beam of ions is tilted to introduce dopants with a desired placement and concentration. In the masking step to form source and drain, if an LDD is formed by an additional ion implantation, the number of masks used can be reduced. However, the ion implantation for formation of LDD is only optimized for a CMOS device. There is thus an issue that a NLDD region is potentially incompletely formed or is not formed at all, in different regions of the wafer. Accordingly, in an example where a device having a high threshold voltage is formed together with a device having a low threshold voltage, the performance of the device is potentially reduced. This occurs because a resistance between source and channel regions of the high-threshold device increases, because the NLDD doping concentration is compensated and/or reduced by the higher doping concentration of the body region of the high threshold device.

In the masking step, to form source and drain, when eliminating masks for formation of NLDD and PLDD, the manufacturing cost is thus reduced. However, eliminating the masks results in an issue that the performance of LDMOS power device is degraded.

Also, in the BCD process, the ion implantation for formation of LDD is only optimized for CMOS device architectures. Therefore, a link between a high concentration N-type source, and an active channel region under the gate in the body region, becomes weak because of doping compensation. Accordingly, this results in an issue with respect to an increase in $R_{dson}$ of the transistor. This issue exists because under the spacer, the insufficient N-type LDD doping is compensated for by the relatively high channel doping also referred to as body doping, resulting in a high resistance under the spacer region, which increases the $R_{dson}$ of the device.

In the example of FIG. 1, there is a first MOSFET 40 having a first threshold voltage $V_{th}$, a second MOSFET 50 having a second Vt, and a third MOSFET 60 having a third Vt, where the MOSFETS 40, 50, 60 are formed by a low-cost manufacturing method in accordance with an example. The first MOSFET 40 is a high threshold NMOS, the second MOSFET 50 is a standard NMOS and the third MOSFET 60 is a standard PMOS.

Here the first $V_{th}$ complies with 0.8 V≤$V_{th}$≤1.2 V, for example. The second and third $V_t$ may have 0.6 to 0.8V and −0.6 to −0.8V as the ranges for their ranges, respectively, for example. Here, $V_{th}$ and $V_t$ both represent threshold voltages, but $V_{th}$ indicates a different threshold voltage used for different parts of the examples. Hence, the first MOSFET 40, in the example of FIG. 1, is identified as a device having $V_{th}$ higher than the second MOSFET 50 or the third MOSFET 60. In order to have such a high threshold voltage in such an example, a P-type doping body diffusion region PBODY having a high concentration is formed in a channel region under the gate electrode.

FIG. 1 is thus to be understood as a configuration in which a CMOS device and at least one N-channel or P-channel device having a high threshold voltage are provided, or in which a CMOS device and a high voltage device are provided together. The high voltage device has a threshold voltage higher than the CMOS device. In contrast, in another example, instead of the device having high threshold voltage, a device having threshold voltage lower than the threshold voltage of NMOS device 50, a low $V_t$ device, is provided. With respect to that example, FIG. 1 is then to be considered by the manner in which NMOS devices having different threshold voltage from each other are provided. In each MOSFET device region, to be in accordance with the device's operation voltage or threshold voltage, multiple body regions are formed. The use of multiple body regions means that examples have at least two body regions, but examples having more body regions are also appropriate. In the example of FIG. 1, the first body region 123, the second body region 124, the third body region 122 are provided. The depths of the multiple body regions potentially differ from each other. The greater the voltage associated with the high voltage device, the deeper the body region depth potentially is. In FIG. 1, though illustrated to show that the various body regions are situated in contact with each other, for a separation of NMOS, PMOS, and high-voltage devices, a WELL region, not shown in FIG. 1, of opposite conductivity type to the body regions is optionally formed between the body regions to help ensure proper electrical characteristics. For example, between a first body region 123 and a second body region 124 which use the same conductivity type, a WELL region of a different conductivity type is optionally added in an example, though not shown. By adding such a region, it enables a device to be operated at each different operational voltage.

Either a deep trench isolation structure (DTI), not shown, or a junction isolation structure formed by using a diffused Well may be formed having deeper depth than the body region. Further, shallow trench isolation (STI), or Local Oxidation of Silicon (LOCOS) optionally provide as a field isolation around the a deep trench isolation structure (DTI), not shown. The STI has a depth lower than a depth of the WELL region, not shown.

Additionally, in order to have a high threshold voltage for a body region, a concentration of a body region that is formed under the gate electrode is designed to be higher compared to a device having a low threshold voltage on a surface. Thus, in the case of the high-$V_{th}$ NMOS device 40, the first body region 123 has a higher concentration than the second body region 124 that is used for the low-$V_t$ device 50. In an example, higher threshold voltage device 40 includes an LDMOS with a dedicated body region 123 having higher doping concentration than the body 124 of the CMOS device 50. By including such a higher doping concentration, this example provides a high threshold voltage for that body region.

On the body regions 122, 123, 124, gate insulating layers 174A, 174B, 174C and gate electrodes 170A, 170B, 170C are situated. Spacers 172A, 172B, 172C and source/drain regions 122C, 123C, 124C are included at both sides of the gate electrodes 170A, 170B, 170C.

In addition, under the spacer 172, LDD regions 123B, 124B, 122B are situated, where the LDD regions 123B, 124B, 122B are low concentration doping region. In other approaches, in order to form an LDD region, an NM (N Minus) LDD mask over the N-channel devices and a PM (P Minus) LDD mask over the P-channel devices are used. In accordance with the examples, an LDD region is formed by a blanket ion implantation without these NM and PM masks. A low-cost semiconductor device manufacturing method is thus provided. This approach is based on a blanket ion implantation of N-type dopants prior to the formation of the spacer 172 around the periphery of the gates 170. The blanket implant of examples is sufficient to compensate for enough of the high-concentration of the first body region 123 of the High-$V_{th}$ device, to ensure a low-resistance link between the source/drain regions 123C and the channel regions of the top portion of the body region 123. The low-cost semiconductor device manufacturing method in accordance with the present disclosure is forming a strong link between the body diffusion region and the source region through the blanket ion implantation, to ensure low parasitic resistance between the source and channel regions, independent of the channel doping. In such an example, the blanket ion implant parameters are selected so that the P-channel source and drain regions are not affected by the blanket implant. Therefore, a nLDMOS, Isolated CMOS, nDMOS, pDMOS, Vertical NPN, Lateral PNP, Schottky diode and other appropriate components are manufactured using such blanket LDD ion implantation. Structures of such components are explained further as follows.

FIGS. 2 to 6 depict views illustrating a manufacturing method for MOSFET semiconductor devices according to an example. FIGS. 2 to 6 demonstrate a low-cost semiconductor device manufacturing method including forming a plurality of body regions in a semiconductor substrate, forming gate insulating layers and gate electrodes in the body region, implementing a blanket ion implantation in an entire surface of the substrate to form a low concentration doping region (LDD region) next to the gate electrode without a mask, forming a spacer at a side wall of the gate electrode, and implementing a high concentration ion implantation to form a high concentration source region and a high concentration drain region around the LDD and gate regions. For example, such a method includes Blanket N-technology, also known as N minus or NM technology, to form a strong source region to provide channel region coupling, in the body region of the high-threshold voltage device without using extra masking layers. By avoiding the extra masking layers, it minimizes costs.

FIGS. 2 to 6 show examples of manufacturing three MOSFET devices at the same time. However, in other examples, in one semiconductor substrate, various MOSFET devices are simultaneously manufactured, or a MOSFET device and a Schottky diode are simultaneously manufactured, or a MOSFET device and a bipolar junction transistor (BJT) are simultaneously manufactured. As another alternative, a MOSFET device and a passive device are simultaneously manufactured. In the examples, a MOSFET device includes devices such as nLDMOS, pLDMOS, Isolated CMOS, Extended Drain NMOS (nEDMOS), Extended Drain PMOS (pEDMOS), and so forth. In example, the BJT device includes devices such as a Vertical NPN or a Lateral PNP. Further, the Diode optionally includes a Schottky diode. In the examples, the above-described devices are manufactured simultaneously and are combined with each other. In the examples, among these combinations of devices, three MOSFET devices is discussed in depth, but the remarks made with respect to combinations of three MOSFET devices also apply to other groups of devices above, as well as other appropriate combinations not discussed.

Figure 2:
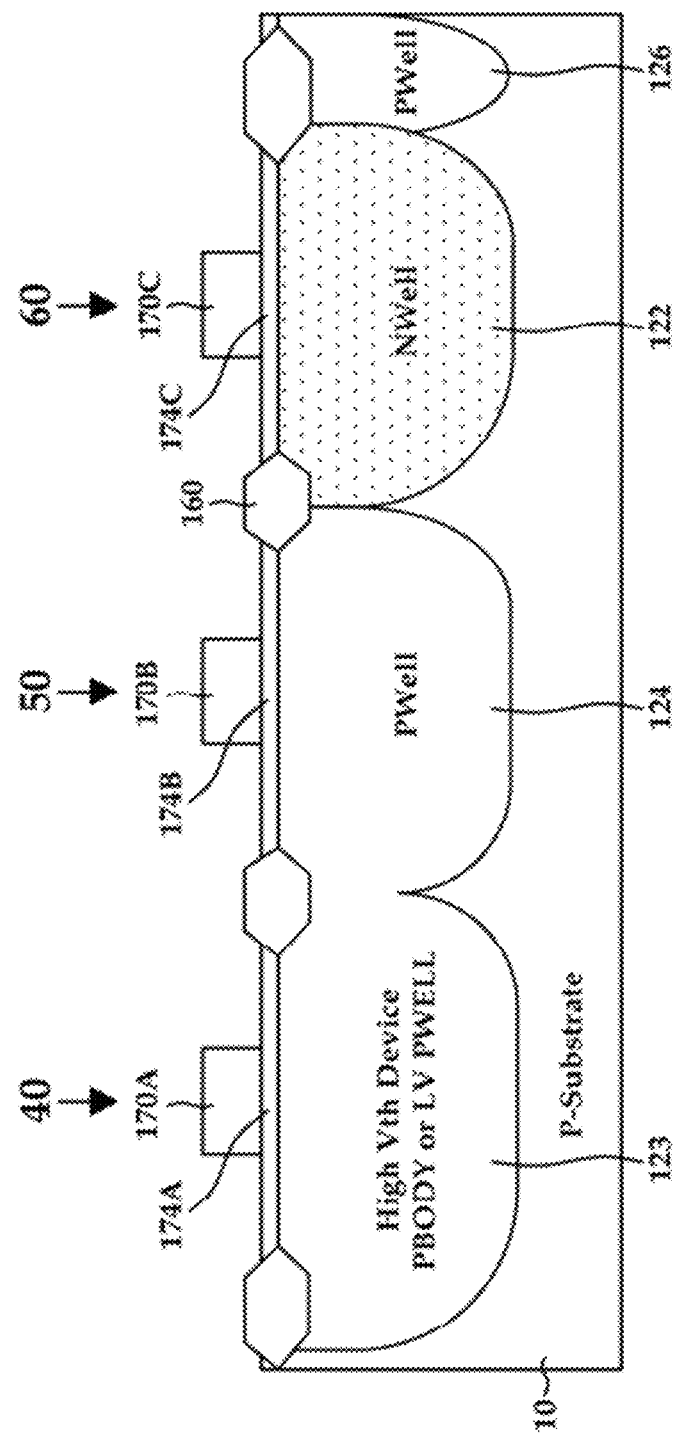
FIGS. 2 to 6 depict views that illustrate a manufacturing method of a MOSFET device according to an example.

Referring now to the example of FIG. 2, a semiconductor substrate 10 having P-type dopants of a second conductivity type is provided with a low dopant concentration.

Referring back to the example of FIG. 2, in order to form MOSFET devices, in the semiconductor substrate 10, in the example of FIG. 2 there are formed a first body region of a second conductivity type 123 for a first MOSFET device 40 having a high threshold voltage and a high voltage operation voltage, a second body region of a second conductivity type (PWell) 124 for a second MOSFET device 50 having a low threshold voltage, and a third body region of a first conductivity type (NWell) 122 for a third MOSFET device 60 having a low threshold voltage. Here, in order for the first MOSFET device 40 to have a high threshold voltage, that is, high $V_{th}$, a concentration of the first body region 123 on a surface of the substrate is chosen to be higher than that of the second body region 124. For example, to have a high threshold voltage of 0.8V, a P-type body diffusion region PBODY having a high concentration is formed in a channel region.

Conversely, in this example, in the first body region 123, a low voltage MOSFET device having a low threshold voltage, that is, low $V_t$ of 0.6V or less is formed, instead of a high voltage MOSFET.

A first body region (NWell) 123 thus becomes a body region having a high threshold voltage; and a second body region (PWell) 124 becomes a body region of NMOS device 50. When forming a first body region 123 and a second body region 124, as well as a third body region 122, for dopants diffusion to occur as discussed, in various example, drive-in annealing is performed at a high temperature, such as a temperature of 1000° C. or more. NWell and Pwell are not blanket implanted. In examples, LOCOS, STI or DTI, or an isolation layer 160 which is a combination of these other isolation layers, are formed for a separation between devices. Gate insulating layers 174A, 174B, 174C are then deposited on the semiconductor substrate, and a conductive layer for a gate electrodes, such as polysilicon, is deposited. For example, gate electrodes 170A, 170B, 170C are respectively formed using a mask for gate electrodes.

Figure 3:
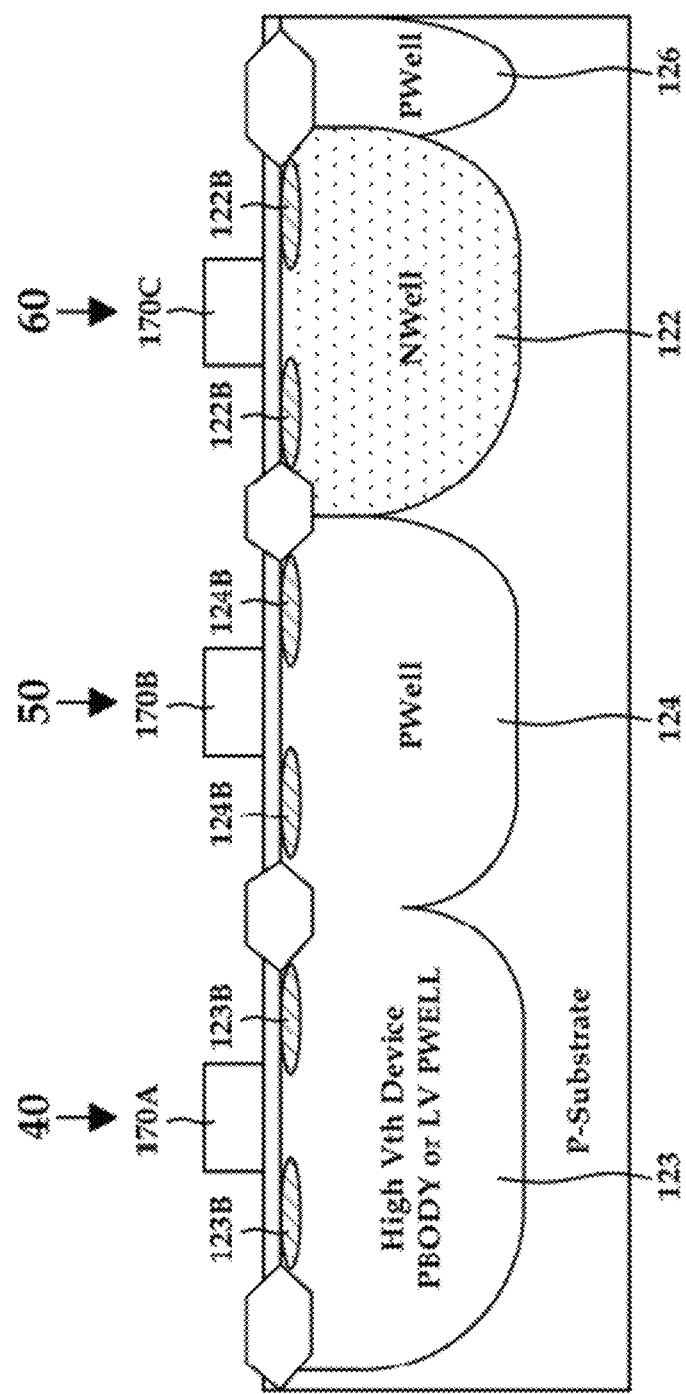

Referring now to FIG. 3, the blanket ion implantation is implemented by being performed in a vertical direction, with respect to an entire surface of semiconductor substrate, using dopants of a first conductivity type. During the implantation process, in an example, a tilt or a rotation is applied to facilitate the implantation. The blanket implants are often repeated multiple times with different rotation actions, such as quad-rotation for example. As part of this process, Low Doped Drain (LDD) regions of first conductivity type 123B, 124B, 122B are formed at sides of gates 170A, 170B, 170C.

In examples, energy used for a blanket ion implantation to form LDD region that is a first semiconductor region is 10-60 KeV; phosphorus (Ph) of N-type dopants may be implanted as being setting-up as dose quantity of 1E11 to 5E13 $cm^{-2}$. Applicants note that reference to a number such as 1E11 refers to the quantity $1*10^{11}$. This is referred to as scientific notation. Such a quantity is a count of ions, atoms, molecules, or other appropriate particles implanted on a physical area. Applicants note that it is potentially preferable that the dose quantity is 1E11 to 5E12 cm$^{-2}$. In this example, the overall LDD dopants concentration becomes 1E18 atoms/cm$^3$ or less.

Figure 4:
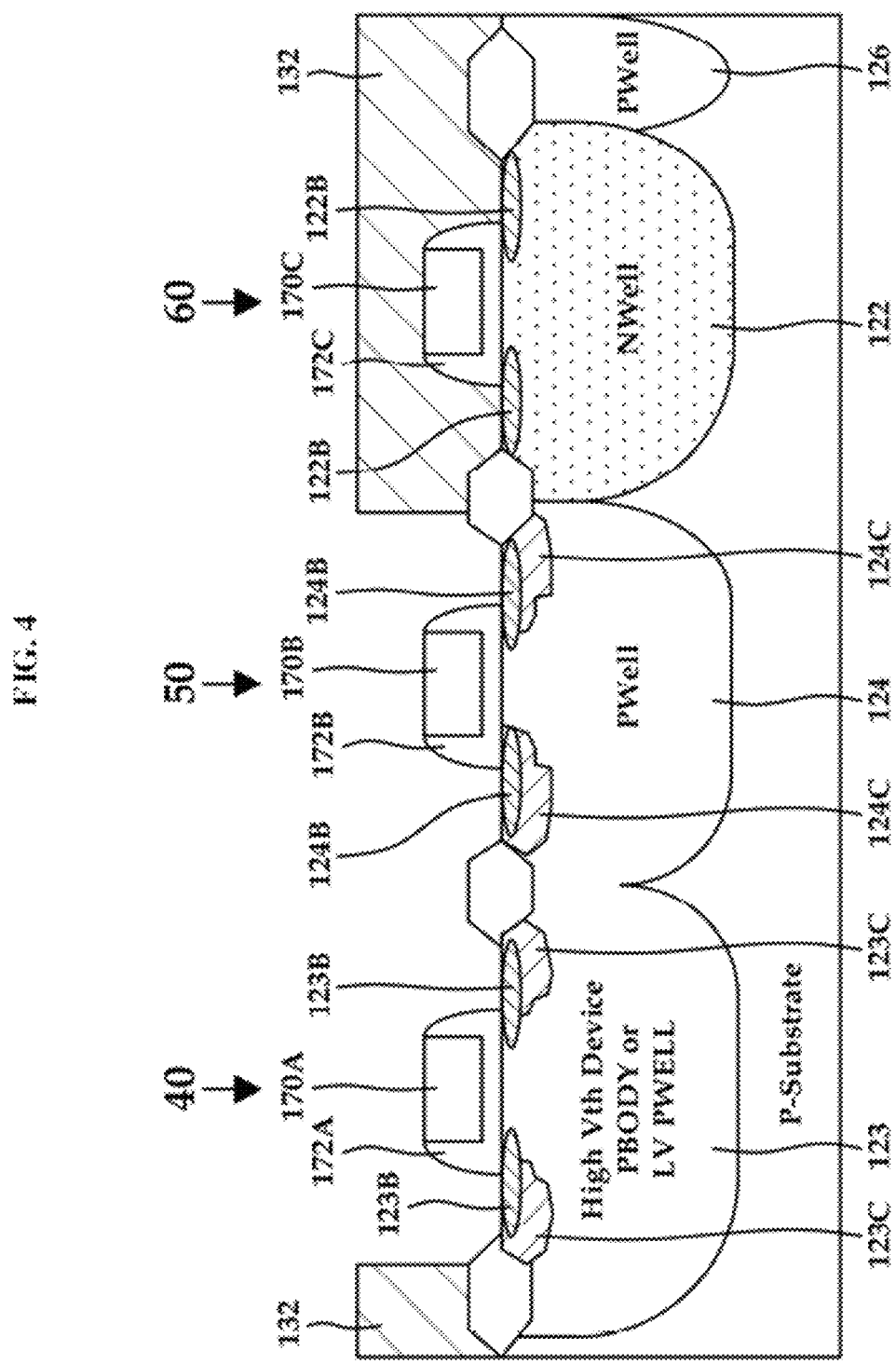

Referring also to the example of FIG. 4, a sidewall spacer 172A, 172B, 172C is formed at a side wall of gate electrodes 170A, 170B, 170C. After forming the sidewall spacer, source/drain implantations having a high doping concentration are conducted, using N+ for the N-channel masks and P+ for the P-channel masks. The high-doped regions 123C, 124C, 122C are adjacent to the low-doped regions, LDD regions 123B, 124B, 122B. These source/drain implants include high-dose ion implants of 5E15 to 1E16 cm$^{-2}$ to form a low-resistance source/drain contact. For example, these low-resistance source/drain contacts may include N+ for N-channel using Arsenic, typically, and P+ for P-channel using shallow Boron or Boron Difluoride (BF$_2$). These source/drain implants also use a tilted and rotated ion implant technologies to form low-doped extension and LDD regions 123B, 124B which extend under the Spacers 172A, 172B. The tilted implants may also include some rotation in order to implant under gate structures extending in any direction on the surface of a wafer. Due to the use of these tilted and rotated co-implants with the S/D implants, there are enough N-type active dopants under the Spacers. Therefore, very low-resistance is present under the Spacers 172A, 172B in the example of FIG. 4.

The source/drain implantations include two-step implantations. In the first step, following the application of a photoresist mask, a first ion implantation is implemented by a high dose quantity and an untilted method. An untilted method means a substantially perpendicular implantation of a second conductivity type dopant with respect to a surface of the semiconductor substrate. The dopants that are first implanted using an untilted approach are Arsenic; and the dose quantity is 5E14 to 1E16 cm$^{-2}$, which is higher than the LDD ion implantation dose. By means of using the high concentration dose quantity, source/drain regions of high concentration, such as a second semiconductor region, are formed.

In the second step, a second ion implantation is implemented that uses a lower dose quantity than the first step. In addition, the second ion implantation uses a tilted and rotated method at a prescribed inclination angle with respect to the surface of the semiconductor substrate. In the N-channel regions, a Phosphorus dopant which is different from the dopants previously implanted in the first ion implantation is used as a dopant for a second tilted implantation. In an example, the same dopants as those dopants used in an LDD blanket ion implantation are used. The energy used for such ion implantation is 10 to 80 KeV. In various examples, the dose quantity is equal to or greater than the dose quantity in the blanket ion implantation and is of a medium quantity that is less than in the first dose quantity. The dose quantity is thus 1E12 to 1E14 cm$^{-2}$. In an example, the tilted angle is predetermined to be an angle of 7 to 15 degrees. The reason for a tilted ion implantation is to supplement previous doping with more dopants of the same conductivity type in the first semiconductor region, that is the LDD region formed by the blanket LDD ion implantation, under the spacer 172. This supplementation is possible because the same dopants as used in the LDD blanket ion implantation are used.

Figure 5:
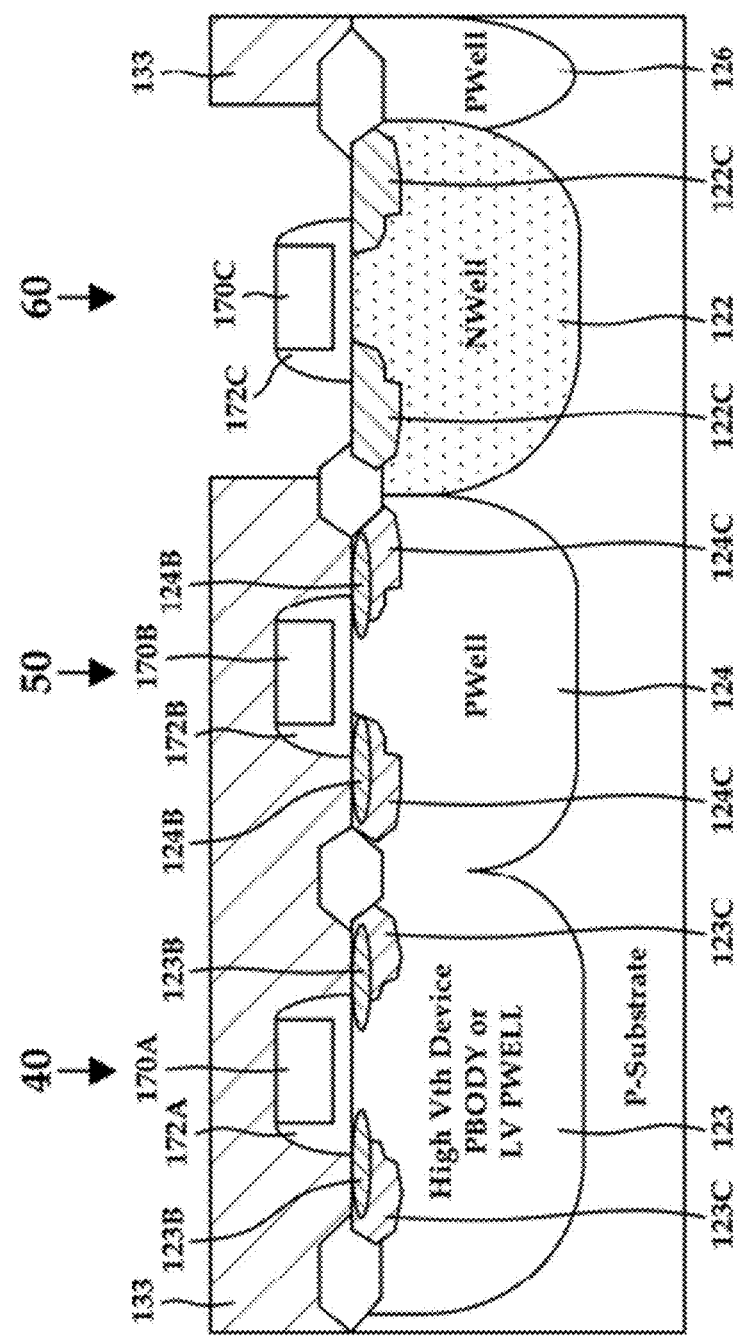

Subsequently, as shown in FIG. 5, a photoresist mask is applied to cover the N-Channel devices 40, 50, and expose the P-channel devices 60. As discussed with respect to the previous low voltage NMOS device manufacturing methods of examples, a two-step ion implantation method is implemented. In the first step, a first ion implantation is an un-tilted method and uses dopants of BF$_2$ or B$_{11}$, where B$_{11}$ is a particular Boron isotope suitable for these applications. The dose quantity is 5E14 to 1E16 cm$^{-2}$.

In the second step, a second ion implantation is implemented by not only using Quad rotations, that is, sets of 4 rotations, but also a tilted angle ion implantation method that is based on a surface of the semiconductor substrate. A Boron dopant is used, as discussed above. In such an example, the energy for ion implantation is 10-80 KeV, the dose quantity is 1E12 to 1E14 cm$^{-2}$, and the tilted angle is tilted by 7-15 degrees, with respect to a surface of the semiconductor substrate. High concentration source/drain regions of a second conductivity type 122C are thereby formed. These source/drain implants also include tilted and rotated ion implants that form low-doped extension and LDD regions 122B that extend under the Spacer 172C. Due to the presence of these tilted and rotated co-implants with the S/D implants, there are enough P-type active dopants under the Spacer 172C. Therefore, very low-resistance is present under the Spacer 172C.

Figure 6:
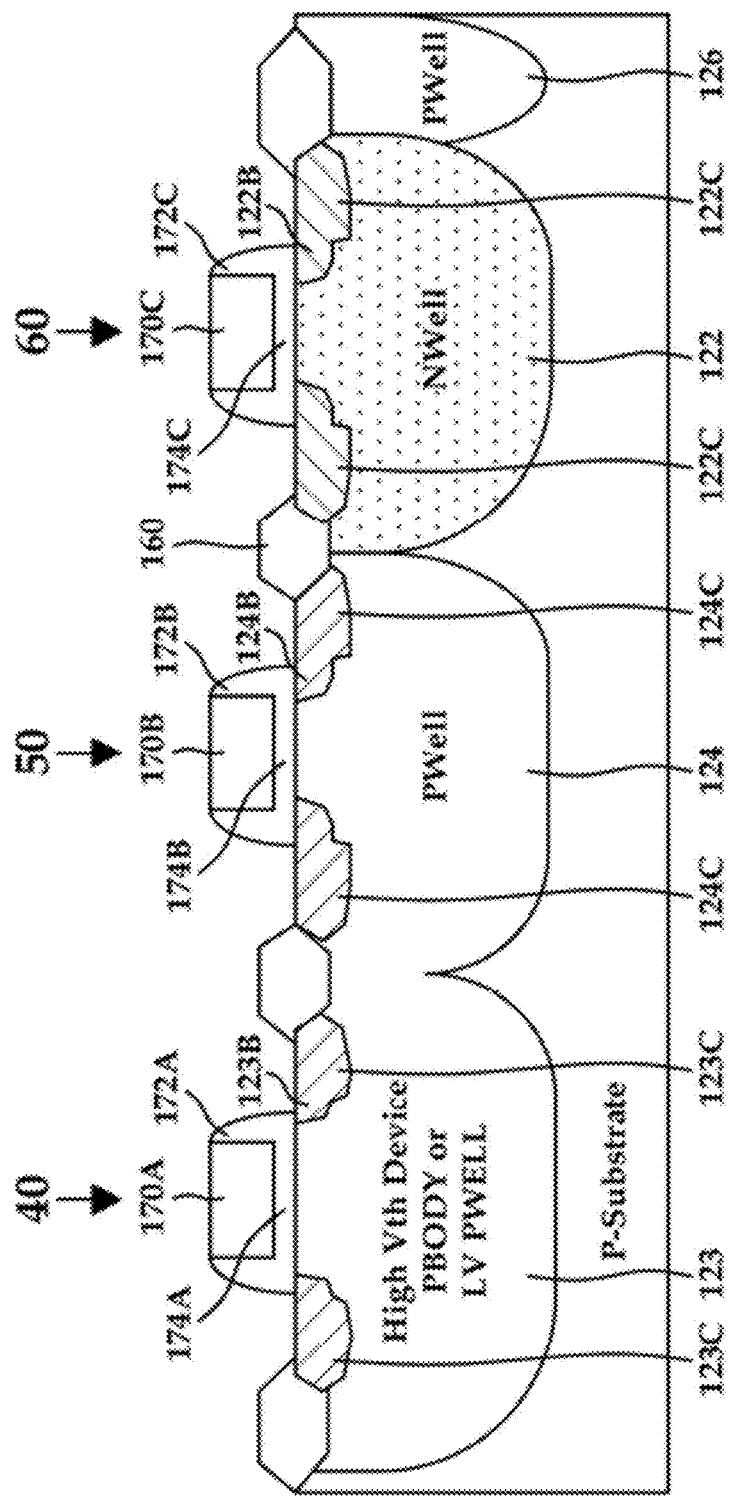

Thereafter, by removing the mask, for diffusion and activation of the dopants, such a device as illustrated in the example of FIG. 6 is produced through thermal annealing. On the high concentration source/drain regions and body contact region and gate electrode, in the example of FIG. 6, a silicide layer is additionally formed. Certain operations are conducted to form a low-resistance link between the N+ Source and channel region of high-voltage devices, including skipping all LDD masking operations, adding a blanket N-LDD implant step, and adding tilted and rotated deep and lower dose LDD implants to the N+ Source/Drain and P+ Source/Drain steps.

Though examples illustrate a manufacturing process whereby a high V$_{th}$ NMOS device, along with NMOS and PMOS devices are simultaneously formed in FIGS. 2 to 6, some of the manufacturing processes of examples include forming an LDMOS device. Therefore, a manufacturing process of nLDMOS device that is simultaneously formed with CMOS device is explained in FIGS. 7 to 9. As mentioned in the preceding FIGS. 2 to 6, such an LDMOS device is formed by a low-cost process, and uses a blanket LDD ion implantation and source/drain ion implantation that uses tilt/rotation to improve the performance of such an LDMOS device while still containing costs.

Figure 7:
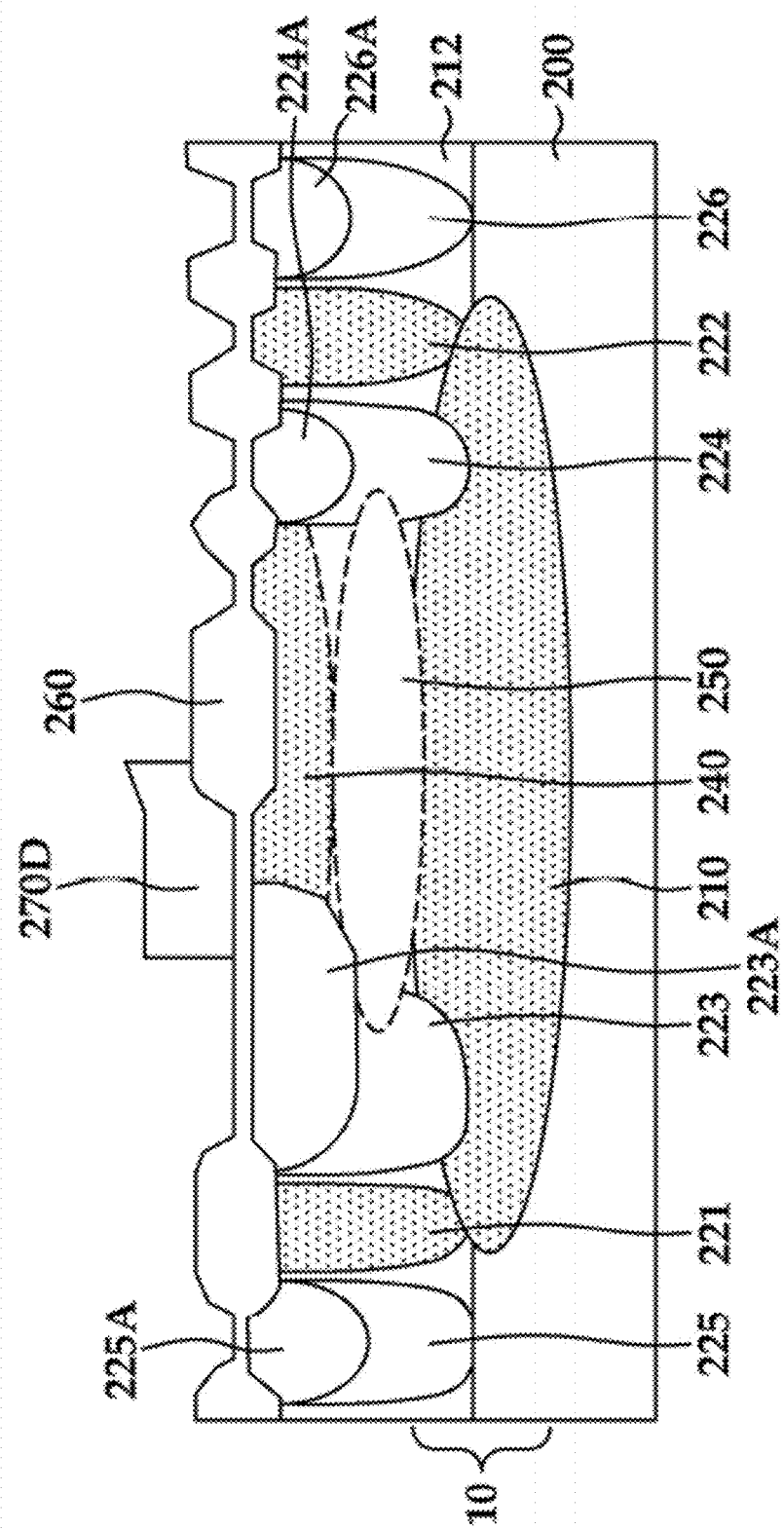
FIGS. 7 to 9 depict views that illustrate a manufacturing method of an LDMOS device in a manufacturing method of a MOSFET device according to an example.

Referring first to FIG. 7, as discussed above, a buried layer of a first conductivity type 210 is formed in a P-type semiconductor substrate 200. A P-type epitaxial layer 212 is situated in the P-type semiconductor substrate 200. WELL regions of first conductivity type NWell 221, 222 and WELL regions of second conductivity type PWell 223-226 are then formed. NWells and PWells are not blanket implanted. NWell and PWell are structures that are formed together when forming the above-explained CMOS device, as previously discussed with respect to FIGS. 2 to 6. A buried layer of a second conductivity type P-buried layer (PBL) 250 is then formed on a buried layer of a first conductivity type 210. A drift region of a first conductivity type (n-DRIFT) 240 is then formed on a buried layer of a second conductivity type 250. The drift region 240 and the second buried layer 250 are formed in a self-aligned fashion, during the same masking operation. The second buried layer 250 is self-aligned with the drift region 240. A gate insulating layer 274 and a gate electrode 270D are formed on an upper portion of the drift region 240. A PN junction region is formed at upper/bottom portions of this example due to the buried layer of the second conductivity type 250.

A body region of a second conductivity type PBODY 223A is formed to be connected with the buried layer of the second conductivity type 250. LDMOS uses a PBODY region 223A for the channel, which is doped higher than the PWell of the NMOS. Implant energy for PBODY 223A ranges from 10 to 100 KeV and dose ranged from 1E12 to 1E15 cm$^{-2}$.

The role of PWell 223 as provided above is to connect PBODY 223A and PBL 250 so as to connect these portions of the example to each other. All of PBODY 223A, PWell 223 and PBL 250 are also physically connected with each other.

A dopant concentration of a body region of a second conductivity type 223A is higher than that of a WELL region of the second conductivity type 223. The role of the buried layer of the second conductivity type (PBL) 250 is to isolate the drift region 240 of the nLDMOS, and to reduce a parasitic BJT characteristic, such as a Vertical and/or Lateral parasitic operation characteristic, that is generated during the device operation. Such structure is referred to as a fully isolated system outlet (FISO) structure. In order to prevent such parasitic BJT operation, a concentration of the buried layer of the second conductivity type (PBL) 250 is to be maximized without impacting the breakdown voltage.

Figure 8:
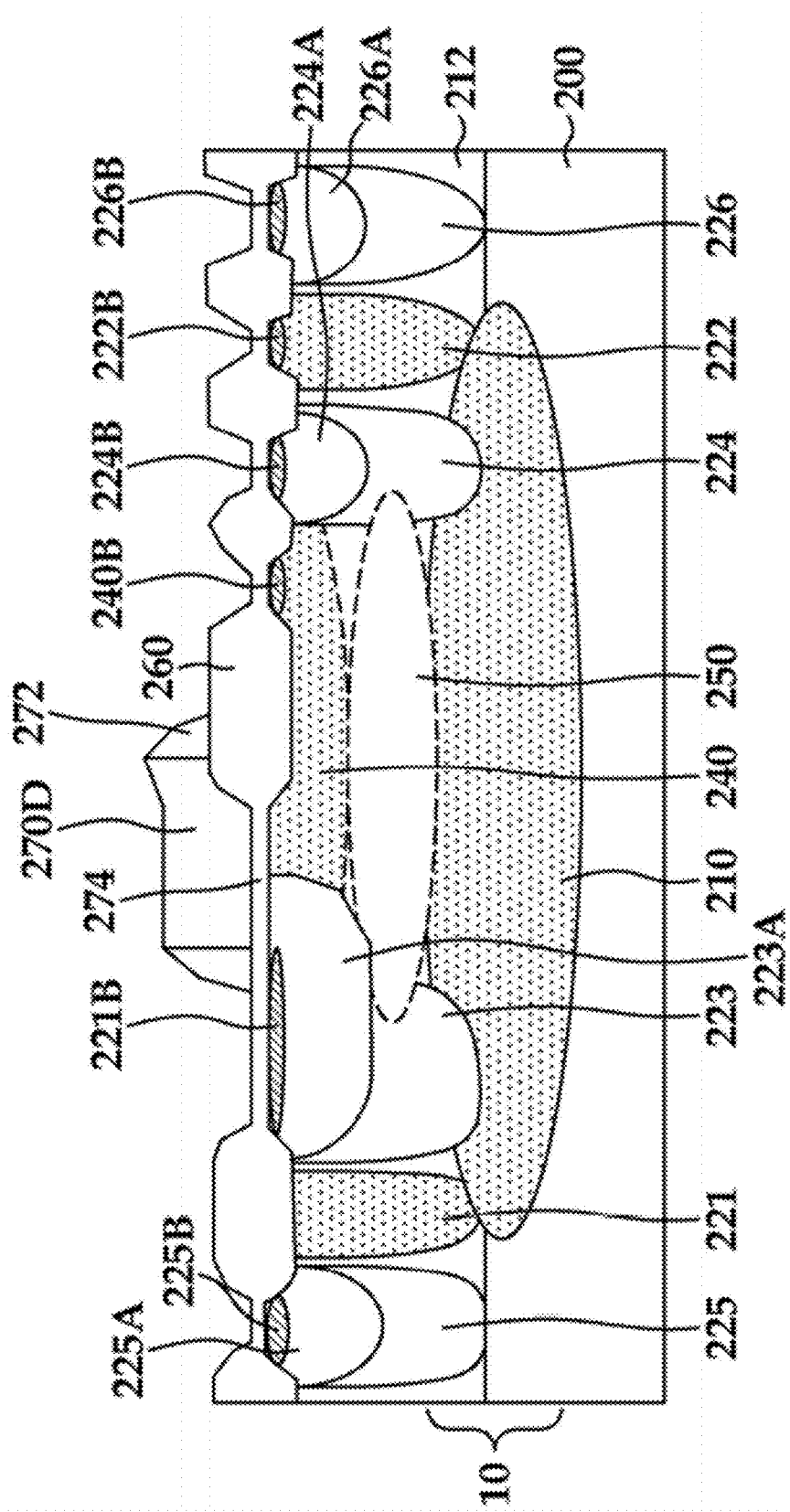

Subsequently, in FIG. 8, an LDD region of a first conductivity type 221B is formed on the semiconductor layer so as to be overlapped with the gate electrode 270D by the blanket ion implantation method, identically to the corresponding approach described for the CMOS device manufacturing process. Thus, the conditions regarding the LDD ion implantation are identical to the above-described MOSFET device manufacturing process. As explained with respect to the CMOS device, DMOS devices are implemented by the blanket ion implantation simultaneously. A spacer 272 is further formed at a side wall of the gate 270D.

Figure 9:
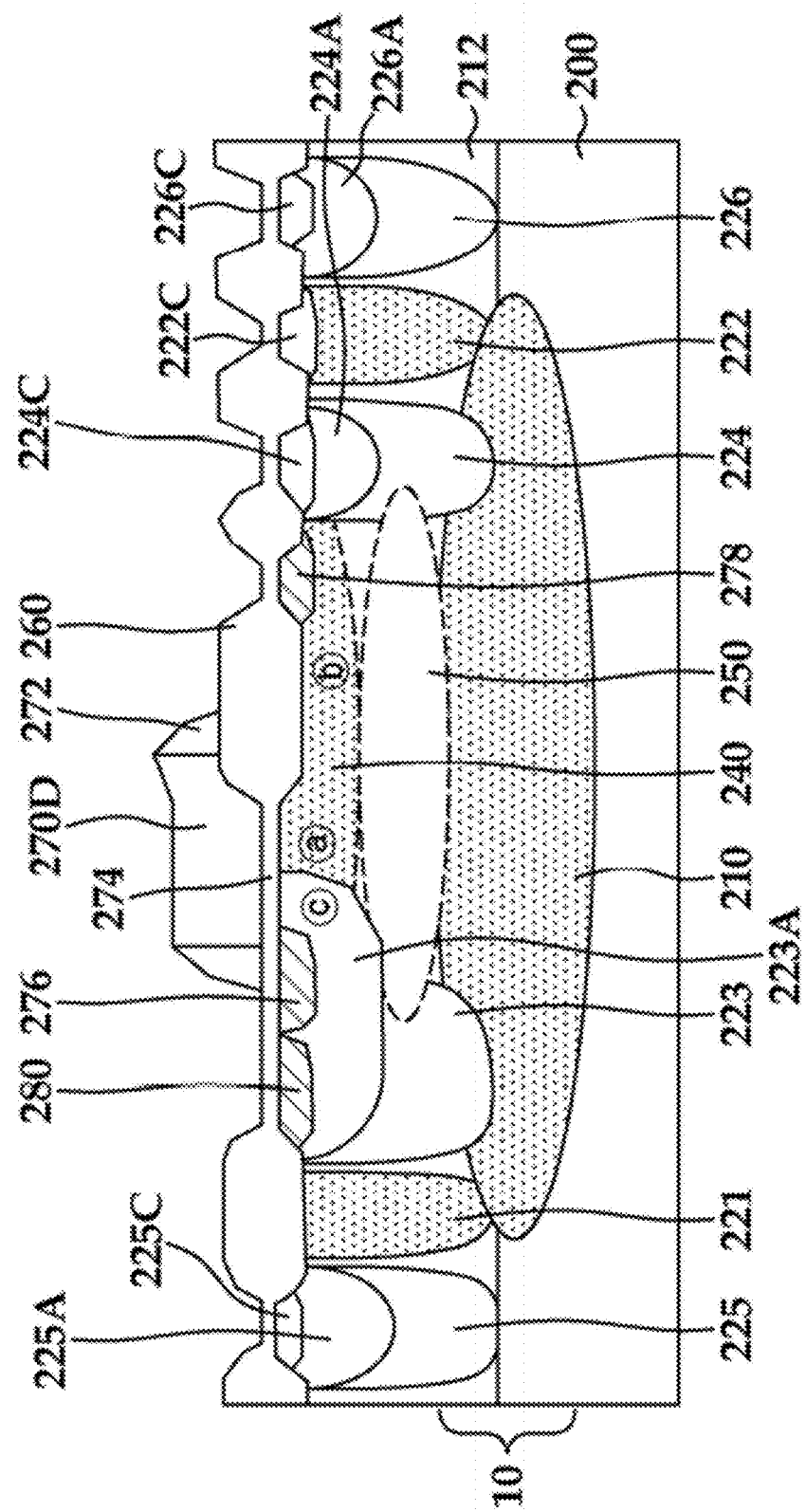

In the example of FIG. 9, which shows the situation that a spacer 272 is formed, high concentration dopants of the first conductivity type are ion-implanted in the semiconductor layer, thus a high concentration source region 276 and a high concentration drain region 278 are formed. The conditions regarding the ion implantation are identical to the above-described MOSFET device manufacturing process, such that the same masking sequence with a N+ mask for N-channel drain and source, a P+ mask for the P-channel source, and drain and body contact of the nLDMOS are used. Namely, the ion implantation method such as a tilt and/or a rotation is used. Thus, more dopants of the N-type are to be doped in the LDD region that is formed by the blanket ion implantation method. Subsequently, high concentration dopants of the second conductivity type are ion-implanted in the semiconductor layer, to thereby form the high concentration body contact region 280 in the nLDMOS device. A high concentration body contact region 280, a high concentration source region 276, and a high concentration drain region 278 are designed to have a higher doping concentration than a doping concentration of the PBODY region 223A so that a parasitic resistance is reduced.

As stated above, a low-cost process as presented in examples is not only used in manufacturing CMOS and nLDMOS/pLDMOS devices, but is also extended to a general BCD device manufacturing process. The BCD device not only includes the above-explained nLDMOS, but also potentially includes isolated CMOS, nEDMOS, pEDMOS, vertical NPN, lateral PNP, BJT, Schottky diode. Thus, among the above-explained first MOSFET, the second MOSFET, and the third MOSFET, one of them acts as an alternative to isolated CMOS, nEDMOS, pEDMOS, Vertical NPN, Lateral PNP, BJT, and Schottky Diode components. The following drawings are views portraying the above-stated devices.

Figure 10A:
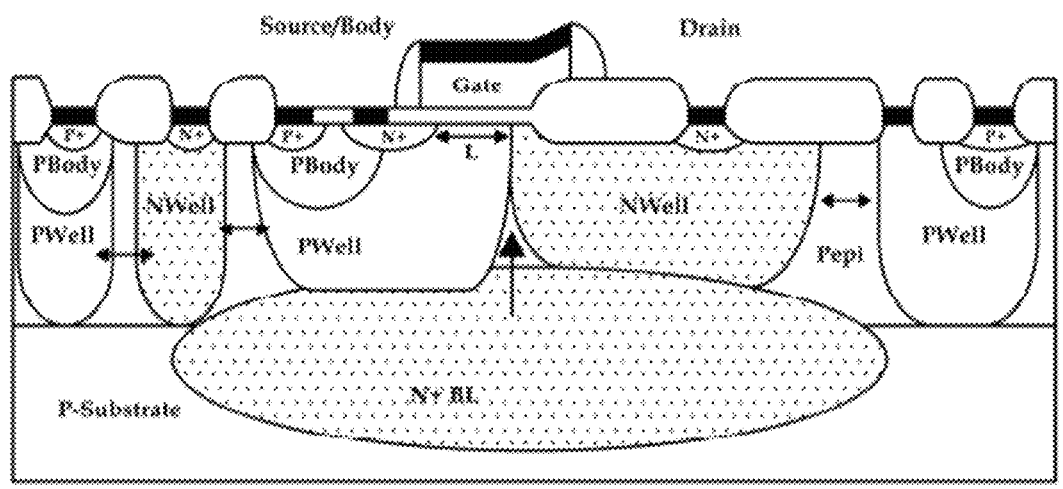
FIG. 10A depicts a view that illustrates an N-channel scalable DMOS device.
Figure 10B:
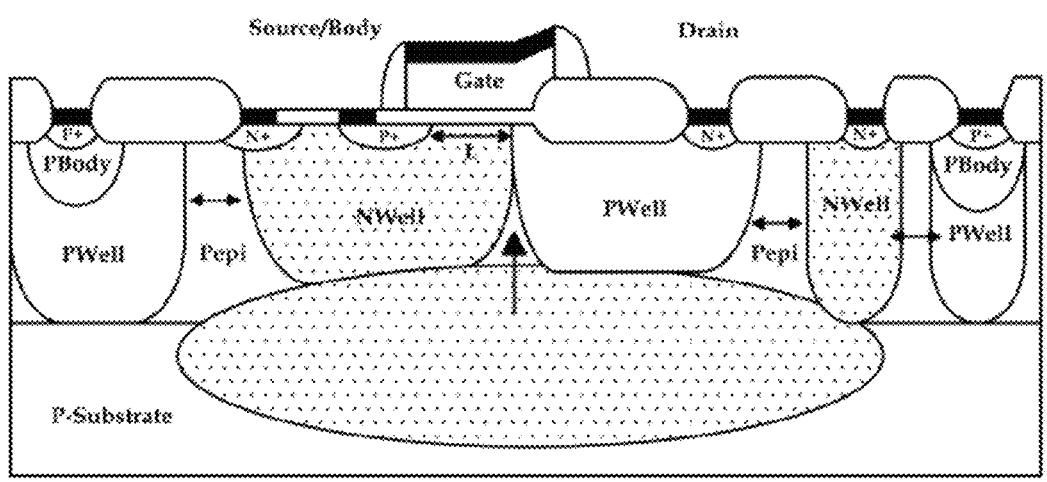
FIG. 10B depicts a view that illustrates a P-channel scalable DMOS device. The devices of FIGS. 10A-10B are manufactured using a low-cost manufacturing method which includes a high concentration source/drain region manufactured by a 2-step method, a blanket LDD ion implantation, tilt/rotation, and other appropriate operations according to an example.

FIG. 10A shows an N-channel scalable DMOS device and FIG. 10B shows a P-channel scalable DMOS device that are manufactured using a low-cost manufacturing method according to examples that includes a high concentration source/drain region manufactured by a 2-step method, including a blanket LDD ion implantation and tilt/rotation and other steps, as discussed. An arrow in a drawing indicates critical spacing. A voltage rating of semiconductor device is changed appropriately by controlling the spacing values.

Figure 11A:
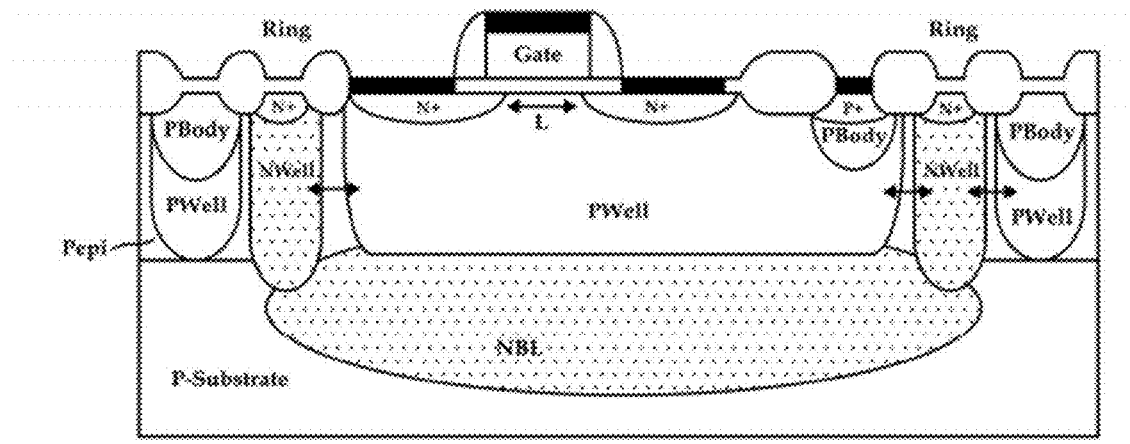
FIG. 11A depicts a view of an Isolated LV NMOS device and FIG. 11B depicts a view of an LV PMOS device, that are manufactured using a low-cost manufacturing method according to an example.
Figure 11B:
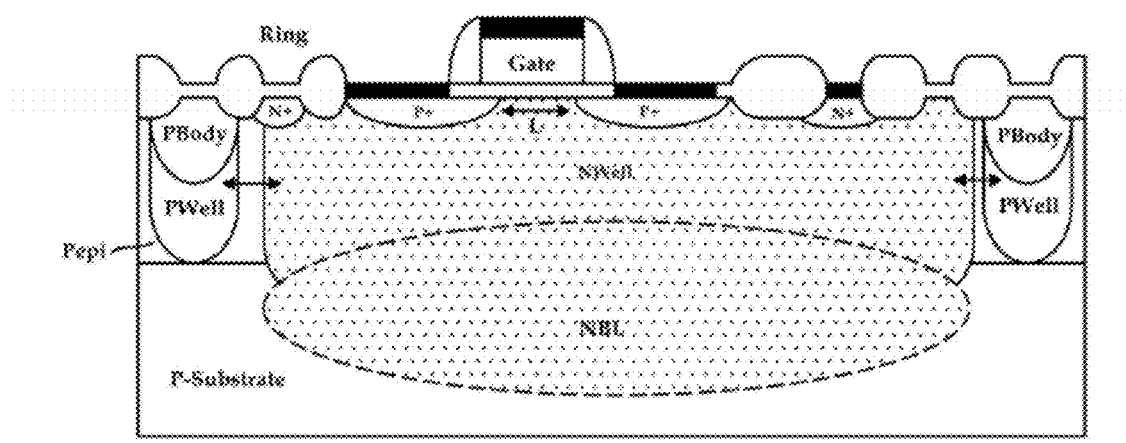

FIG. 11A shows an Isolated LV NMOS device and FIG. 11B shows an LV PMOS device that are manufactured using a low-cost manufacturing method according to examples that comprises a high concentration source/drain region manufactured by a 2-step method, including a blanket LDD ion implantation and tilt/rotation and other steps, as discussed. As stated above, an arrow in a drawing indicates a critical spacing. A voltage rating of semiconductor device s changed appropriately by controlling the spacing values.

Figure 12:
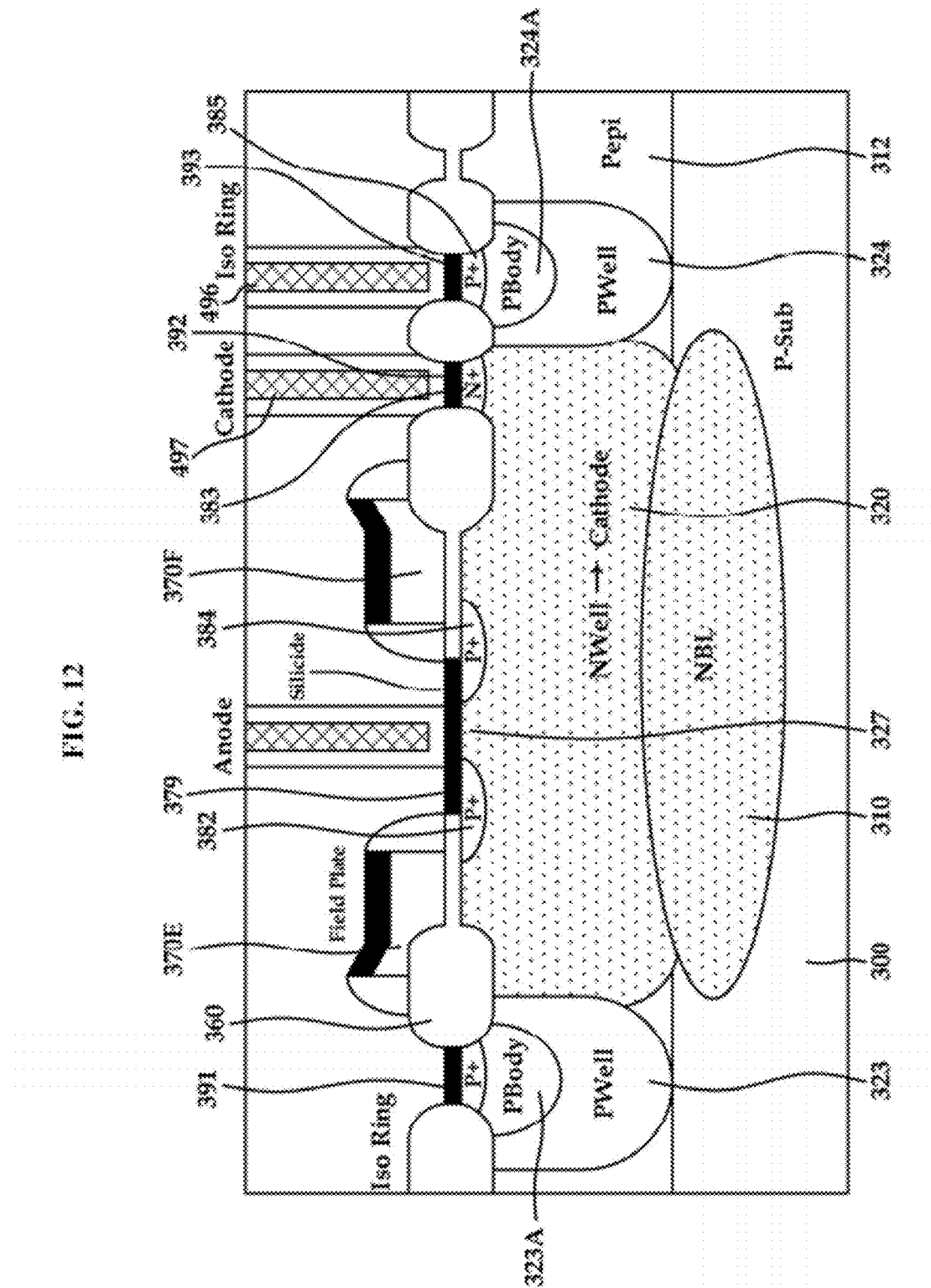
FIG. 12 depicts a view of a Vertical Schottky Diode device that is manufactured using a low-cost manufacturing method according to an example.

FIG. 12 shows a Vertical Schottky Diode device that is manufactured using a low-cost manufacturing method according to examples that comprises a high concentration source/drain region manufactured by a 2-step method, including a blanket LDD ion implantation and tilt/rotation and other steps, as discussed. In the example of FIG. 12, there is formed a high concentration P-type doping Guard ring 382, 384 around a silicide Schottky contact region 379 that is in contact with an anode electrode. An NWell region 320 forms a cathode region under the silicide Schottky contact region 379. A high concentration N-type doping region 383 then forms a cathode electrode on the NWell 320. A high concentration N-type buried doping layer (NBL) 310 is formed under the low concentration NWell region 320, thereby preventing the resistance reduction of NWell. At both sides of NWell 320, an Isolated Ring 323, 324 is formed for providing a separation from other devices, which consists of a high concentration P-type doping region 391 393, PBody region 323A, 324A, and PWell region 323, 324. A blanket LDD ion implantation is implemented as well in formation of the Schottky Diode. The blanket LDD is formed in NWell region 327 directly under the Silicide Schottky contact region 379 of the semiconductor substrate. In order to form the Schottky contact, a blanket LDD ion implantation is implemented at a low dose of dopant so that a concentration of dopant becomes 1E18 atoms/cm$^3$ or less. In this example, the dose quantity follows the same conditions stated above with respect to other examples.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a semiconductor device, the method comprising:
   preparing a first region and a second region in a semiconductor substrate;
   forming a first body region having a high concentration of dopant in the first region to form a high-threshold voltage device;
   forming a second body region having a low concentration of dopant in the second region to form a low-threshold voltage device;
   forming a gate electrode over the first body region and the second body region;
   blanket implanting dopants of a second conductivity type into the first body and second body region to form low-doped drain (LDD) regions;
   forming a spacer next to the gate electrode; and
   source-drain implanting a second conductivity type of dopant to form a low-resistance source/drain region and low-doped extension that extends under the spacer,
   wherein the source-drain implantation comprises tilted and rotated implantation, and
   wherein the blanket implantation and the source-drain implantation are sufficient to compensate for enough of the first body region of the high-threshold voltage device, to ensure a low-resistance link between the source/drain region and a channel region.

2. The method of claim 1,
   wherein the blanket implantation has a low dose ranging from 1E11 to 5E13 ions cm$^{-2}$.

3. The method of claim 1,
   wherein the source-drain implantation further comprises performing substantially perpendicular implantation of a first dose with respect to a surface of the semiconductor substrate.

4. The method of claim 1, wherein the tilted and rotated implantation comprises a second dose lower than the first dose at a tilted angle with respect to the surface of the semiconductor substrate so as to form the low-resistance link under the spacer.

5. The method of claim 4,
   wherein the first dose ranges from 5E14 to 1E16 ions cm$^{-2}$ and the second dose ranges from 1E12 to 1E14 ions cm$^{-2}$.

6. The method of claim 1,
   wherein the blanket implantation skips all masking operations when forming the low-doped drain region.

7. A method of manufacturing a semiconductor device, the method comprising:
   preparing a first region and a second region in a semiconductor substrate;
   forming a first body region having a high concentration of dopant in the first region to form a high-threshold voltage device;
   forming a second body region having a low concentration of dopant in the second region to form a low-threshold voltage device;

forming a gate electrode over the first body region and the second body region;

blanket implanting dopants of a second conductivity type into the first body and second body region to form low-doped drain (LDD) regions;

forming a spacer next to the gate electrode; and source-drain implanting a second conductivity type of dopant to form a low-resistance source/drain region and low-doped extension that extends under the spacer.

8. The method of claim 7, wherein the source-drain implantation comprises tilted and rotated implantation.

9. The method of claim 8, wherein the tilted and rotated implantation comprises a second dose lower than the first dose at a tilted angle with respect to the surface of the semiconductor substrate so as to form the low-resistance link under the spacer.

10. The method of claim 9, wherein the first dose ranges from 5E14 to 1E16 ions $cm^{-2}$ and the second dose ranges from 1E12 to 1E14 ions $cm^{-2}$.

11. The method of claim 7, wherein the blanket implantation and the source-drain implantation are sufficient to compensate for enough of the first body region of the high-threshold voltage device, to ensure a low-resistance link between the source/drain region and a channel region.

12. The method of claim 7, wherein the blanket implantation has a low dose ranging from 1E11 to 5E13 ions $cm^{2}$.

13. The method of claim 7, wherein the source-drain implantation further comprises performing substantially perpendicular implantation of a first dose with respect to a surface of the semiconductor substrate.

14. The method of claim 7, wherein the blanket implantation skips all masking operations when forming the low-doped drain region.

* * * * *